United States Patent [19]

Tripp

[11] 4,177,420
[45] Dec. 4, 1979

[54] MAJOR AND MINOR SHORT LEAKAGE DETECTOR

[76] Inventor: Charles W. Tripp, 15241 Oak Ridge Way, Los Gatos, Calif. 95030

[21] Appl. No.: 903,536

[22] Filed: May 8, 1978

Related U.S. Application Data

[63] Continuation-in-part of Ser. No. 851,593, Nov. 14, 1977, abandoned.

[51] Int. Cl.$^2$ .......................................... G01R 31/02
[52] U.S. Cl. ..................................................... 324/51
[58] Field of Search ....................... 324/51, 52, 133, 54

[56] References Cited

U.S. PATENT DOCUMENTS

| | | | |
|---|---|---|---|
| 2,716,216 | 8/1955 | Schwenzfeier | 324/52 X |
| 3,157,870 | 11/1964 | Marino et al. | 324/133 X |
| 3,281,677 | 10/1966 | Baggott | 324/51 X |
| 3,551,796 | 12/1970 | Holder et al. | 324/51 |
| 3,621,384 | 11/1971 | Yamada | 324/52 |
| 3,699,433 | 10/1972 | Smith | 324/52 |
| 3,870,950 | 3/1975 | Laass | 324/133 X |
| 3,956,697 | 5/1976 | Nery | 324/133 |
| 4,021,730 | 5/1977 | Brinegar | 324/52 |

Primary Examiner—Gerard R. Strecker
Attorney, Agent, or Firm—C. E. Tripp

[57] ABSTRACT

A short circuit detector for battery powered vehicle circuits has a current lead for connection to the positive battery terminal from which the battery cable has been disconnected, a sensor lead for connection to the disconnected cable, a silicon controlled rectifier and vehicle light bulbs connected across said leads for dissipating high currents caused by a major short, a trigger transistor connected across the leads for turning said rectifier on in response to the current drawn by any short as low as a few milliamperes, a minor short oscillator and a speaker for producing a constant frequency tone that signals a minor short, a major short oscillator for modulating said minor short oscillator causing it to produce a warbling tone that signals a major short, and a discriminator transistor responsive to the amount of current flowing across said leads, for energizing said major short oscillator only in the presence of a major short. In an improved circuit the resistive action of the light bulbs is supplied by a power transistor which is triggered to conduction by a short.

27 Claims, 6 Drawing Figures

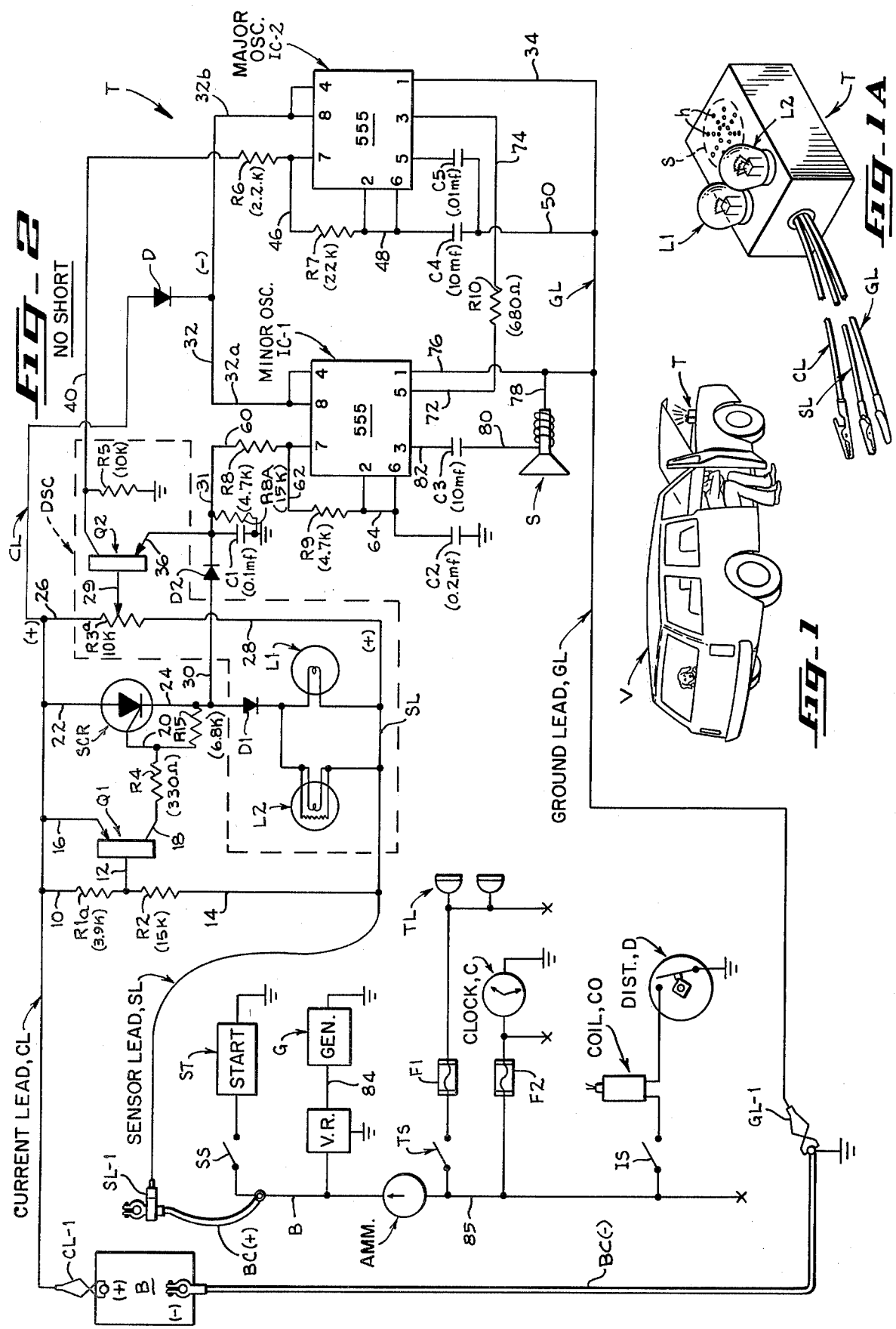

MAJOR SHORT

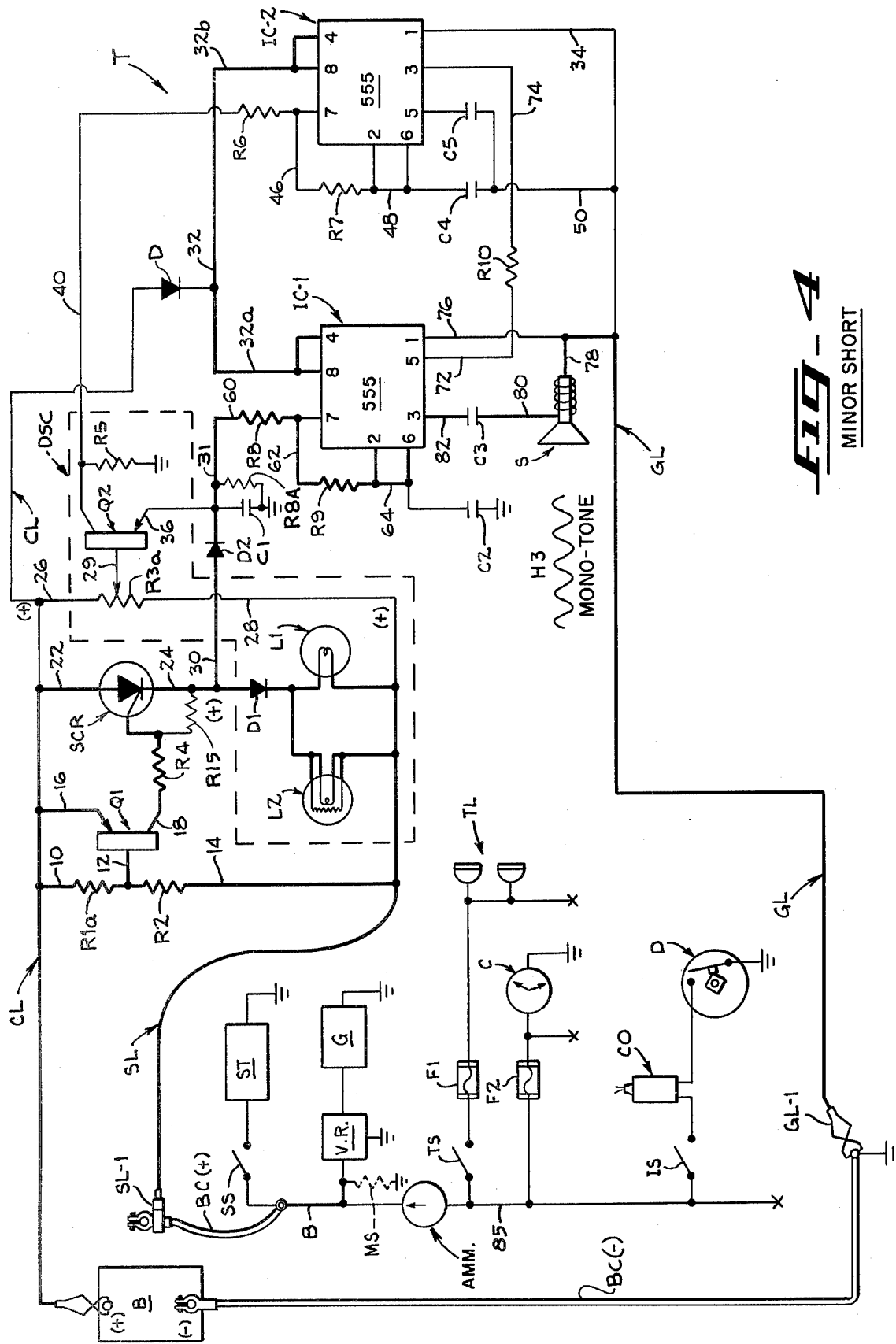

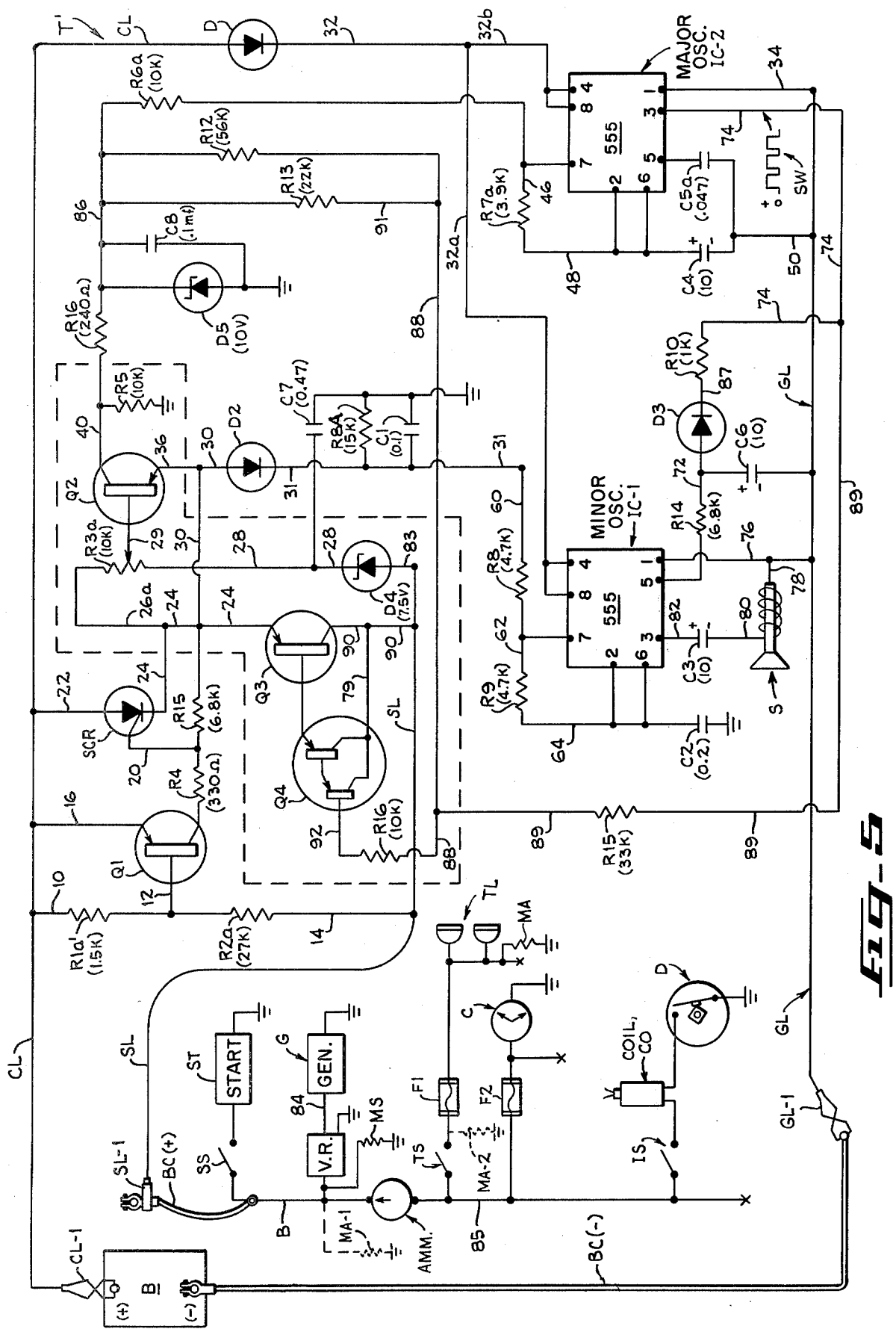

MAJOR AND MINOR SHORT LEAKAGE DETECTOR

REFERENCE TO RELATED APPLICATIONS

This application is a Continuation-in-Part of my parent application, Ser. No. 851,593, filed Nov. 14, 1977, now abandoned.

FIELD OF THE INVENTION

This invention relates to measuring and testing and more particularly to a device for detecting the presence of "major and minor" shorts in a wiring system such as a battery powered system of a motor vehicle.

DESCRIPTION OF PRIOR ART

The U.S. Pat. No. 2,716,216, to Schwenzfeier Aug. 23, 1955, discloses a short circuit detector having a "resistance element" 10 in the form of an electromagnetic coil 12, the terminals of which are connected between the positive post of the battery and the disconnected battery cable by two leads 17 and 40. In the presence of a short, the coil core 13 vibrates an armature 14 and creates an audible tone in an alarm horn 11, indicating the presence of a short. The location of the shorted wire is determined by surrounding the wire with an induced current ring 33 of a detecting element. When a short is present, the induced current in ring 33 magnetically attracts an armature 47 causing a battery 30 to light a lamp 29. The amount of current which the coil will dissipate is not disclosed but vibrators of this type usually require a relatively high amount of current for their operation. If the resistance of the coil 12 of the aforesaid patent is low enough to maintain the vehicle wiring circuit in operation during testing, and to pass major short currents that blow out a fuse, the detector would be utterly insensitive to low drain or leakage currents of a few milliamperes. Conversely, if the resistance of the coil 12 were high enough for the detector to be sensitive to low drain currents such as a few milliamperes (a rather unlikely assumption) then the coil would burn out in the presence of a major short. Under these circumstances, the presumption is that the coil resistance of the Schwenzfeier patent is low enough to handle a current of several amperes and that this amount of current is required to operate the vibrating armature 14. Under these conditions, it is obvious that a minor short in the order of a fraction of an ampere (or somewhat more) would give no indication from the instrument, and this presumption is reinforced by the intent to use the insensitive induced current detector ring 33 with the resistance (coil) element. In any event, the instrument of Schwenzfeier provides no means for distinguishing between a major and a minor short in the wiring system, and it would not produce two completely discrete and separate and readily distinguishable audible tones having different frequency characteristics, one for each type of short.

Another deficiency of the Schwenzfeier tester is that if it were made sensitive enough to detect low drain or minor short currents, the instrument would burn out when checking modern vehicles which have electric clocks because when these clocks automatically rewind they draw relatively heavy currents.

The U.S. Pat. No. 2,292,927, to Kamper Jan. 28, 1941, discloses an electrical tester having clip leads 35,36 connected across (not in series with) the battery circuit and a sharp probe 16 is provided for testing the condition at various parts of the vehicle wiring. Green and red lamps 24,25 are provided and they both burn dimly when no short is detected by the probe 16 or when it does not make connection with the vehicle circuit. A first light is bright and a second light is shorted out when the probe touches ground and the second light is bright and the first one is shorted out when the probe touches a hot wire. The tester will not maintain the wiring circuit in operation through its own circuit and it will not automatically indicate the presence of no short, a major short or a minor short without utilization of the probe. Also, it requires manual manipulation, coupled with observation of the lamps 24 and 25.

Bowden U.S. Pat. No. 3,074,013, Jan. 15, 1963, shows in FIG. 2 a device for indicating short circuits which depends on the brilliancy of a series of lamps wired into the tester. If a short is present the lamps are bright and if no short is present they are dim. This device could not indicate the presence of a minor, fractional ampere short and the same remarks apply to the version shown in FIG. 3 of this patent. Furthermore, the device will not maintain a vehicle wiring circuit in operation by current drawn through the device.

The U.S. Pat. No. 3,437,916, to Mazurkevics Apr. 8, 1969, discloses a three light testing arrangement for testing the voltage regulator output of automobile voltage regulators. The clip leads 18 and 19 are connected to the plus and minus terminals of the voltage regulator under test and the presence of a low, good or high voltage output of regulators is indicated by illumination of one of three lamps, 12, 13 or 14. This instrument cannot be connected to a battery post and a disconnected battery cable to automatically indicate the presence of either a major or minor short, in accordance with the present invention.

The U.S. Pat. No. 3,571,701, to Tin-Hwai Lai Mar. 23, 1971, discloses a detector that tests for leakage currents between an appliance casing and ground in domestic appliances, tools, etc., powered by the usual 110 volt current. If the appliance casing is grounded, a gas discharge tube 2 will break down and light and a buzzer 3 will emit a tone. This tester is not intended to be inserted in series with a battery in a vehicle electrical circuit and if it were, the tester could not handle 10 to 20 amperes in case of a major short without damage to the buzzer and also be sensitive enough to emit a tone in the presence of a few milliamps or more. If the buzzer were sensitive enough to detect such a minor short, it would burn out in the presence of a major short. Also, the indication of the nature of the short depends upon the intensity of the tone from the buzzer and the brightness of the lamp 2 and evaluation of the nature of the short is a matter of judgement because two discrete and distinguishable signals are not produced in accordance with the nature of the short.

The U.S. Pat. No. 2,712,684, to Briner Sept. 29, 1950, discloses an electrical testing apparatus that requires connection to a 110 volt AC source (FIG. 3), the use of a step-up transformer 26 and a lamp 24, the brightness of which is indicative of the nature of the short. The tester requires two switches as well as a set of probes connected to test jack terminals 20, 22 for making leakage tests. In the modified form of FIG. 4, a separate battery power supply and a vibrator are required to provide a high voltage for the voltage step-up transformer required in accordance with the principles of the Briner apparatus.

Other patents less pertinent than those mentioned above are:

Craford et al U.S. Pat. No. 3,964,039, June 15, 1972
Burger et al U.S. Pat. No. 4,005,365, Jan. 25, 1977

SUMMARY OF THE INVENTION

The circuit tester of the present invention will detect, audibly indicate the presence of and clearly distinguish between major and minor (leakage) shorts in DC powered electrical circuits. The embodiments to be described are particularly adapted to detect such shorts in vehicle wiring systems, and an important feature of the invention is that although the tester will maintain the vehicle system in operation in the presence of a major short that draws enough current to blow a fuse, it will also distinctly indicate the presence of a minor short which only draws a current as low as a few milliamperes.

In order to trouble shoot with the detector, one battery cable is disconnected (the positive cable in the embodiment shown) and current and sensor clip leads are connected to the battery terminal and to the disconnected cable. A ground clip lead is connected to a grounded element of the circuit and the tester is placed in any convenient position (usually near the battery) and left there during trouble shooting. A transducer, such as a permanent magnet speaker, emits a tone in the presence of a short, but when all electrical vehicle components are turned off and no major or minor leakage shorts are present in the wiring system, the speaker remains silent. However, under all circumstances, the vehicle wiring system is fully energized through the tester itself. Hence, if a major short (such as a short of 8–10 amperes or more is present, the speaker will automatically produce a distinctive tone (e.g., a tone having one frequency characteristic) informing the mechanic of the presence of a major short. If there is a minor or leakage short (which may draw a few milliamperes) the tester automatically emits a tone of a different frequency characteristic. If the major short draws enough current in a fused circuit to blow a fuse, that fuse can be replaced and the tester will energize the re-fused but shorted portion of the vehicle electrical system while maintaining the integrity of the replaced fuse.

In the presence of either a major or minor short, the resultant current flow (even a flow as low as a few milliamperes) will trigger a solid state main switch (such as a silicon controlled rectifier) into conduction which switch is in series with a resistance or current dissipating means low enough to produce a small voltage drop under low current, minor short conditions but which produces a voltage drop that is high enough to dissipate enough of the current drawn by major short to protect a fuse if the short is in a fused line. One means of providing this resistance or current dissipating action is to employ a resistance of the heater type, such as ordinary vehicle headlight bulbs, so that in the presence of a major short the bulbs light up and their resistance increases, thereby dissipating enough current to prevent the smoking of vehicle circuit wires and to protect fuses. Under minor short conditions, the bulbs are either not lit or dimly lit and offer substantially no resistance to a minor short.

In an improved and preferred circuit, this resistance or current dissipating action is supplied by a silicon power transistor that is mounted on a conventional heat sink and is biased into conduction by a low current and presents a low resistance under such minor short conditions. Under major short conditions, the power transistor conducts enough current to test for shorts and also acts as a higher resistance, dissipates power and provides a voltage drop that prevents blowing fuses in the vehicle. In order to prevent overheating of the power transistor under major shorts, it is pulsed on and off at a 3 Hz rate. When pulsed to the off state, the transistor acts as a high resistance and limits the current through the tester and vehicle circuitry to less than one ampere. This limits the heat dissipation requirements of the power transistor under major short conditions.

The aforesaid generation of discrete tones of different frequency characteristics indicates the nature of the short and hence provides a clue to the mechanic as to possible locations thereof.

The preferred trouble shooting procedure is that of removing fuses and/or disconnecting suspected elements or wires of the electrical system until the tester speaker is silenced. The mechanic has both hands free and can conduct his investigations under the dash, under the car, at the rear of the car or in any position and is kept fully aware whether or not he has found the fault by simply listening for the presence or absence of a tone emitted by the tester speaker.

In the preferred embodiments of the invention disclosed herein, the frequency characteristic of the speaker tone is determined by the conditions of two oscillators. For example, in the presence of a minor short, only one oscillator is energized and the speaker produces one distinctive tone (a continuous monotone of one frequency and intensity). In the presence of a major short, both oscillators are energized, one of which modulates the output of the other, causing the speaker to produce a tone of a different frequency characteristic, such as a warbling tone.

More specifically, in the tester of the present invention, a discriminator circuit determines whether one or both of the oscillators are energized into oscillation. In the original embodiment, the discriminator circuit includes the aforesaid heater resistance which presents a low resistance to minor short currents but which causes a significant voltage drop across current and sensor leads of the tester during a major short and an adjustable threshhold discriminator switch, such as a transistor, is biased to conduct and activate the modulating oscillator only in the presence of a major short. In the improved and preferred embodiment, the heater resistance function is supplied by a power transistor and associated control circuitry.

In the discriminator circuit, the threshhold between a minor short current and a major short current is determined roughly by selecting the value of the heater resistance in the original circuit and precisely by adjusting the bias on the discriminator transistor that determines whether or not the major short oscillator will operate in both the original and improved circuits.

The tester can be made compact, the principle circuit elements therof being solid state devices. Vibratory contacts or connections to internal or external power sources are not required and the current dissipating resistance element is conveniently provided in the original embodiment by the use of two conventional vehicle light bulbs connected in parallel, or in the improved circuit by a silicon power transistor mounted on an aluminum heat sink. The transducer or tone emitting element is preferably a miniature permanent magnet dynamic speaker.

BRIEF DESCRIPTION OF THE DRAWINGS

FIG. 1 is a view showing utilization of one embodiment of the tester on a vehicle.

FIG. 1A is a perspective view of the tester.

FIGS. 2-4 are schematic circuit diagrams with the tester connected to a vehicle wiring system under no short, major short and minor short conditions, respectively.

FIG. 5 is a schematic diagram of the improved and preferred circuit.

Referring to FIG. 1, the operator is locating a short in a vehicle V and the tester T is emitting a tone indicating the presence of either type of short. The operator is in the process of disconnecting suspected wires under the dash of the vehicle. FIG. 1 illustrates one of the awkward positions often required to locate shorts and shows how the tester of the present invention leaves both hands free for trouble shooting.

Figure 3:
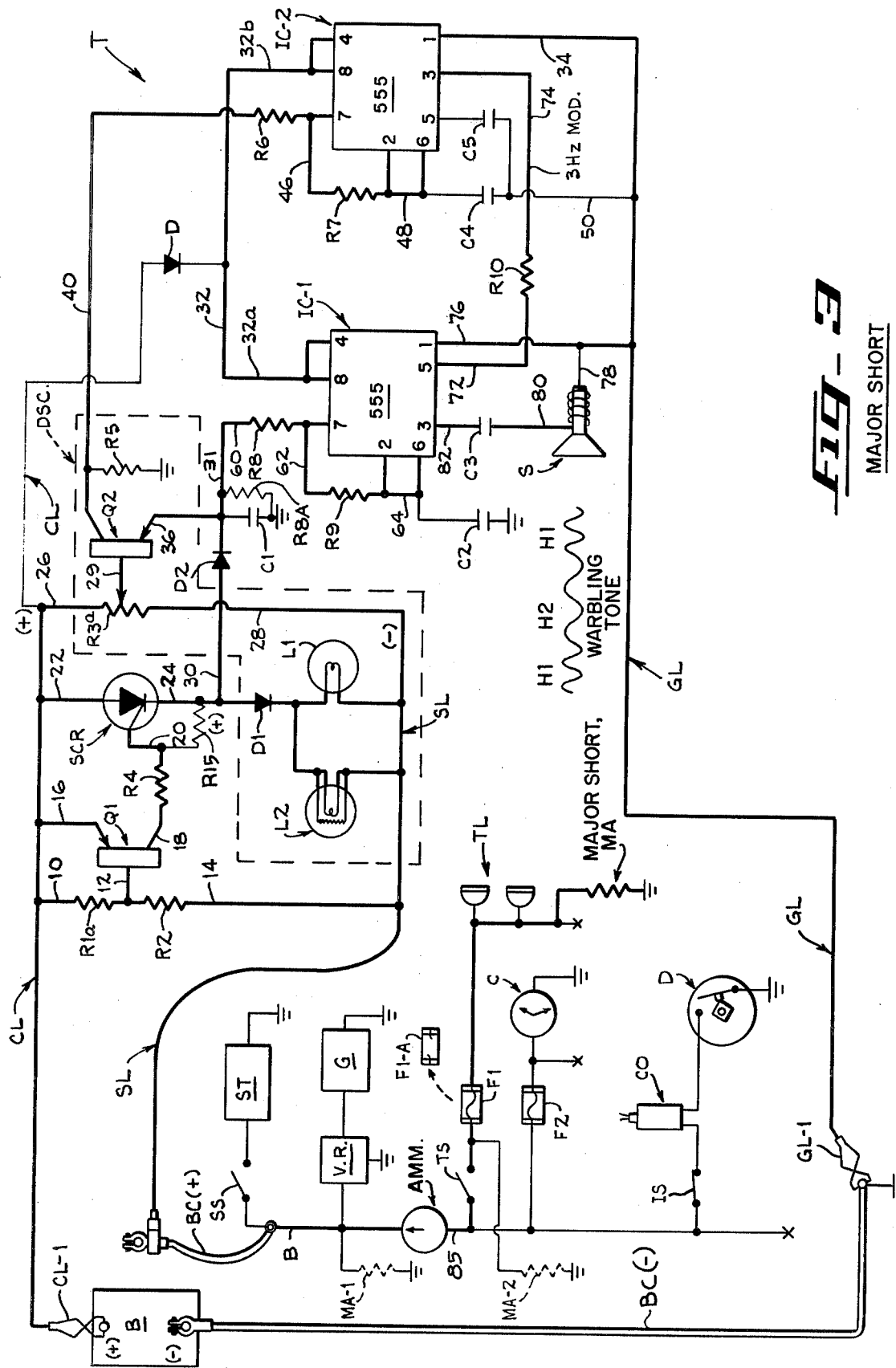

Referring to the embodiment of FIG. 1A, the tester T is mounted in a conventional small instrument box whose greatest dimension is about 3½ inches. One face of the box is provided with holes beneath which a minature speaker S is mounted. Two vehicle light bulbs L1,L2 (heater resistances) are plugged into the tester and although these may or may not light up during testing the operator need not observe the bulbs during his tests.

Emerging from the box are three leads, namely, a current lead CL having an alligator clip CL-1 for connection to a battery post from which the battery cable has been disconnected; a sensor lead SL having an alligator clip SL-1 for connection to the disconnected battery cable and a ground lead GL having an alligator clip GL-1 for connection to any grounded portion of the vehicle wiring system.

BRIEF DESCRIPTION OF THE CIRCUIT

The circuit diagram of FIG. 2 shows the circuit of the tester T connected to a 12 volt, negative ground vehicle battery and wiring system and also shows a few of the elements of a typical vehicle wiring system. The positive battery cable BC (+) has been disconnected from the positive battery post and the clip lead CL-1 of the current lead CL has been connected to the post. The alligator clip SL-1 of the sensor lead SL has been connected to the disconnected battery cable BC (+) and the clip GL-1 for the ground lead GL has been grounded. These connections are maintained without alteration until the short is isolated.

The circuit of the tester includes a trigger switch such as a sensitive germanium PNP trigger transistor Q1 for the gate of a silicon controlled rectifier switch SCR, which is the main current conducting switch. A line 10 from the current lead CL connects through a 3.9K resistor R1a to the base line 12 for the trigger transistor R1 to the base line 12 for the trigger transistor Q1. A 15K resistor R2 in series with R1a connects the line 12 to the sensor lead SL through line 14. The emitter of Q1 is connected to the current lead CL by line 16 and the collector of Q1 is connected to the gate of SCR through a line 18, a 330 ohm resistor R4 and a line 20. The anode of SCR is connected to CL by line 22 and its cathode is connected by line 24 to the anode of a diode D1. A 6.8K resistor R15 is connected between R4 and line 24.

A heater resistance in the form of parallel connected, 12 volt vehicle light bulbs L1,L2 is connected in series with SCR through the diode D1 and these elements are connected across the current lead CL and the sensor lead SL. As mentioned, the bulbs L1,L2 offer substantially no resistance to low leakage currents, but they serve as a current dissipating resistance to prevent smoking of the vehicle wiring and the blowing of fuses in case of a major short, and they form part of the discriminator circuit DSC for discriminating between major and minor shorts. The discriminator circuit also includes a 10K potentiometer R3a connected across the current lead CL and the sensor lead SL by lines 26,28 and having a center tap 29 for the base of a silicon PNP discriminator transistor Q2. The center tap 29 is adjusted to provide the selected bias for the base of Q2, which along with the selected resistance of L1,L2 determines the threshold point between major and minor short signals from the tester.

The signal producing portion of the circuit includes two oscillators, a minor short oscillator IC-1 and a modulator or major short oscillator IC-2. In the embodiment shown, these oscillators are the well known 555 timer integrated circuits, such as the RS 555, provided by Radio Shack division of the Tandy Corporation Co., Ft. Worth, Tex. Of course, it is to be understood that other circuits for providing oscillation under the required circumstances can be employed. In the circuit diagram, the terminal numbers of the oscillators are indicated. For ready reference, the function of the 555 terminals are listed below:

| Terminal | Function |
| --- | --- |
| 1 | Ground |
| 2 | Trigger |
| 3 | Output |
| 4 | Reset |
| 5 | Control Voltage |
| 6 | Threshhold |
| 7 | Discharge |
| 8 | Vcc (Power) |

Returning to the circuit description, in order to activate the oscillator IC-1, a line 30 leads from the cathode of SCR to the anode of a diode D2 and the cathode of the diode D2 connects to a line 31. A line 36 from line 31 supplies current for the emitter of the discriminator transistor Q2. This circuit is filtered by a 0.1 mf condenser C1 in parallel with a 15K silencing resistor 1R8A connected to ground.

It has been found that the idling current drain of commercial 555 oscillator printed circuit components may vary and that it is preferable to isolate the power supply for these components from the load on the SCR in order to insure that the tester output will turn off when all shorts under test are removed. In order to power the oscillators, the current lead CL is connected through a diode D to lines 32, 32a and 32b which power the oscillators IC-1 and IC-2 by connecting to their Vcc and reset pins 8 and 4. Pin 1 of IC-2 is grounded to GL by line 34.

Referring now to the output of Q2, its collector line 40 is connected to ground through a 10K resistor R5 and it also connects to the discharge pin 7 of IC-2 through a 2.2K resistor R6. A branch line 46 from pin 7 connects through a 22K resistor R7 to a line 48 leading to the trigger and threshhold pins 2, 6 of the major short oscillator IC-2. This circuit is timed by a 10 mf condenser C4 which is connected to the ground lead GL by a line 50. The control voltage pin 5 of IC-2 is connected to a 0.01 mf condenser C5 which is also connected to the ground lead GL by line 50.

The discharge pin 7 of the minor short tone oscillator IC-1 receives current from a line 60 branching from line 31, and a 4.7K resistor R8. The trigger and threshhold pins 2, 6 receive current from the lower end of R8 by a branch line 62, a 4.7K resistor R9 and a line 64. Line 64 connects to one side of a 0.2 mf timing condenser C2, the other side of which is grounded. It is to be noted that in some portions of the circuit diagrams conventional ground symbols are used, but functionally, these represent connections to the ground lead GL within the instrument.

The control voltage pin 5 of the minor short oscillator IC-1 receives modulation pulses from the major short oscillator IC-2 by line 72, a 680 ohm resistor R10 and line 74 from the output pin 3 of IC-2. Pin 1 of IC-1 is grounded to GL by line 76.

The coil of a miniature electrodynamic speaker S is connected between the gound lead GL and the output pin 3 of the minor short oscillator IC-1 by a line 78, the speaker coil, line 80, a 10 mf condenser C3 and a line 82.

SIMPLIFIED VEHICLE WIRING CIRCUIT

A simplified vehicle wiring circuit for purposes of explanation is shown in the form of FIGS. 1-4 and FIG. 5. The circuit shown includes the battery B with its positive cable BC(+) disconnected and its negative cable BC(−) grounded. The positive cable connects through the starter switch SS to the grounded starter ST. A positive fuse B connects to BC(+) for supplying current to various vehicle electrical components. A grounded generator G (or alternator in modern vehicles) supplies current during vehicle operation through line 84 to a voltage regulator VR and on to the bus B. The bus B connects to one terminal of an ammeter AMM, the other ammeter terminal supplying current to a line 85, which is shown broken off because it usually supplies current to other vehicle components, not shown.

Branching from line 85 is a light switch TS which is fused at F1 and energizes the tail lights TL through a grounded wire shown broken off. The headlights (not shown) may receive current through fust F1 in the tail light circuit or from a separate fused circuit (not shown) leading from the downstream side of the switch TS. A grounded clock C receives through a fuse F2 from the line 85. Also shown is the ignition switch IS for energizing a high tension coil CO when the grounded contact points of a cam operated distributer D are closed in the conventional manner. It is to be understood that the vehicle wiring circuit shown is merely presented as an example and is incomplete because the circuit details differ in various vehicles.

OPERATION

No Short Condition

Referring to FIG. 2, in order to test for a short, whether it draws a few milliameres or draws enough current to smoke wires or blow out a fuse, in the embodiment described for negative grounded circuits, the positive battery cable BC(+) is disconnected, the current lead CL is connected to the (+) battery terminal, the sensor lead SL is clipped to the positive battery cable BC(+), and the ground lead GL is grounded. These connections are never changed during the test procedure.

When there is no short and no current drain from the vehicle wiring system, the sensor lead SL will see an almost infinite resistance to ground, will be at the full positive battery potential (e.g. 12 volts) and thus will draw no current either through R1a, R2 or through potentiometer R3a from the positive current lead CL. With no voltage drop across resistors R1a, R2, the base line 12 from the junction of R1a,R2 for the trigger transistor Q1 will be at full positive battery potential, which will reverse bias the base of Q1 and render it non-conducting. When Q1 is non-conducting, no current flows from its collector line 18, through R4 and through line 20 to the gate of the SCR. The SCR is non-conducting and its anode line 22 draws no current from the positive current lead CL.

When SCR is non-conducting, the voltage at the cathode line 24 of SCR will be negative, relative to its anode line 22. The cathode line 24 of SCR cannot be rendered positive from the current lead CL, resistors R1a,R2 and R3a, line 14 and 28 and through the low resistance bulbs L1,L2 because of the diode D1. Thus the cathode line 24 of SCR will be held at a negative potential relative to its anode line 22 because of a connection to ground through line 30, diode D2, and resistor R8A. With SCR nonconducting, no current flows from line 30 through diode D2 to to line 31 and hence there is no current through R8 to the discharge pin 7 of the minor oscillator IC-1 and the latter will not oscillate. However, current is supplied from CL, diode D, and lines 32a,32b for the Vcc terminals 8 and the reset terminals 4 of the 555 oscillator circuits of both tone oscillators IC-1 and oscillator IC-2. As will be seen, although major oscillator IC-2 receives power, it is also turned off. These oscillators are wired for astable operation (oscillation) but under the "no short" condition just described, they will not oscillate, and the speaker S is silent.

Also under the no short condition of FIG. 2, the NPN discriminator transistor Q2 will not conduct. The center tap 29 of the potentiometer R3a, which biases the base of the discriminator transistor Q2, is set at a selected positive potential from the positive current lead CL. Since the sensor lead SL is not grounded through the vehicle wiring system (with all switches and other electrical components turned off), the sensor lead SL is held at full positive potential through R1a,R2 and R3a. The emitter line 36 is grounded through R8A and hence the center tap base line 29 of Q2 is positive relative to its emitter. Thus, the discriminator transistor Q2 is reverse biased and is non-conducting.

When the discriminator transistor Q2 is not conducting, the major short oscillator IC-2 will not oscillate, because under no short conditions, there is no current flowing in the collector line 40 of Q2 and this line will be held at ground potential through grounded resistor R5. Collector line 40 of Q2 must supply current at a positive potential through R6 to pins 7 (discharge), 2 (trigger) and 6 (threshhold) to initiate oscillation at the output terminal 3 of IC-2 supplies no modulation frequency through R10 to the control voltage pin 5 of the minor short oscillator IC-1, but this is immaterial because the discharge pin 7 of the minor short oscillator IC-1 is held at ground potential by R8A (through which no current is flowing) under no short conditions, IC-1 is not oscillating and the speaker remains silent.

Major Short (FIG. 3)

It will be assumed by way of example that the resistance of bulbs L1,L2 and the setting of potentiometer R3 is such that the threshold between the minimum major short current and the maximum minor short current is a current of about 8-10 amperes. This threshold current selection merely represents a preferred or typical selected value, one reason for its selection being that the current of 8-10 amperes will not blow most fuses, and the switching on of relatively low current components such as the ignition switch, head lights, stop lights, etc. will not provide a major short signal.

Referring to FIG. 3, it will be assumed (by way of example) that a fused major short MA to ground is in the circuit of the vehicle tail lights TL. As will be explained, if the major short MA draws a current of 8 amperes or more, the sensor lead SL is held at substantially ground or negative potential (providing an unblown fuse F1 is installed in the circuit) by the short. As previously described, the sensor lead SL was at a positive potential under no short conditions. However, the relatively high current drain caused by the major short MA automatically creates a new circuit condition in the tester circuit.

The substantial ground of sensor lead SL by the major short MA draws current through line 14,R1a,R2, line 10 and CL. Because of the voltage drop across R1a, the base line 12 of the trigger transistor Q1 is now at a negative potential, relative to its emitter line 16 which is at a positive potential from line 10. This applies a negative bias to the base of trigger transistor Q1 which now conducts current from its emitter line 16, through the transistor, the collector line 18, R4, line 20 and hence to the gate of SCR.

The SCR now conducts and current flows from the positive terminal of batter B and current lead CL through line 22 to the anode of SCR. Current flows through SCR to cathode line 24, through the diode D1, through the parallel bulbs L1,L2, and the sensor lead SL. The major short current flow continues through the disconnected battery cable BC(+) through the ammeter of the vehicle, through the tail light switch TS (closed for test purposes) through the fuse F1 (it is assumed in this example that the original fuse F1A blew and has been replaced by a new fuse FL, which will not blow, as will be described) and through the major short MA to ground. Since SCR is conducting due to a major short that is sufficient to blow a fuse, the bulbs L1,L2 light up to a substantial degree, their resistance increases, and the resultant voltage drop across the bulbs renders the sensor lead SL more negative than it was when SCR was turned off. However, the voltage at the SCR cathode line 24 is positive and a current at a positive potential passes through line 30, diode D2 to line 31. Positive potential is supplied from line 31 through line 60 and R8 to the discharge pin 7 of the minor short oscillator IC-1, causing it to oscillate at its normal, predetermined audio frequency (about 3,000 Herz) at its output pin 3, through line 82, condenser C3, line 80, the coil of speaker S and line 78 to the ground lead GL. Although this energizes the speaker, the normal frequency of IC-1 is modulated, as will be seen.

In order to produce the distinctive warbling tone from the speaker which indicates a major short, the major short oscillator IC-2 is also caused to operate. The positive potential in lines 32, 32b to pins 4 and 8 (reset and power Vc) conditions the oscillator chip IC-2, for operation as a pulse oscillator or modulator. Current flowing through portions of the discriminator circuit DSC, namely, diode D1 and the lighted bulbs L1 and L2 causes a voltage drop across bulbs L1,L2 which is sufficient to dissipate enough current so that the remaining current which does flow through sensor lead SL, the vehicle wiring circuit, the new fuse F1 and the major short MA will not blow out the new fuse. Thus, the vehicle wiring circuit remains in an operating condition for testing, even though a major short exists which might draw a circuit sufficient to blow a fuse in the circuit.

As mentioned, under major short conditions, the discriminator transistor Q2 (which is also part of the discriminator circuit DSC) is rendered conducting. The sensor lead SL is connected by line 28 to the low end of potentiometer R3a and since the lead SL is held at ground (−) potential by the major short MA, enough current flows through potentiometer R3a to bring its center tap 29 to a negative potential relative to the emitter line 36 which is positive when SCR is conducting. The center tap 29 of R3a was initially adjusted to forward bias the transistor Q2 into conduction under major short conditions.

With Q2 conducting, current flows from the cathode line 24 of SCR, through branch line 30, diode D2, line 31, emitter line 36, the transistor Q2, its collector line 40, and through R6. Current is now supplied to the discharge pin 7 of IC-2 and through line 46, R7 and line 48 to the trigger and threshold pins 2, 6 of the major short oscillator IC-2, initiating its oscillation. As mentioned, both oscillators receive power from CL through diode D.

The time constant of R7 and condenser C4 connected between the discharge pin 7 of IC-2 and the ground lead GL causes IC-2 to oscillate at about a three Hz frequency in the present example. The output pin 3 of IC-2 is connected through line 74, R10 and line 72 to the control voltage pin 5 of the minor short oscillator IC-1. The 3 Hz signal from IC-2 modulates the normal 3,000 Herz output frequency of IC-1 at its output pin 3, causing oscillation at pin 3 of IC-1 to vary between 4,000 Hz (H1) and about 2,000 Hz (H2) (with the circuit values given) at a frequency of 3 Hz.

Thus, under major short conditions, both oscillators are oscillating and oscillator IC-1 produces a warbling tone through the speaker, which is easily distinguished from its normal constant frequency tone or from any other tone made by the tester under conditions other than those produced by a major short, such as the short MA (or in some cases by leaving the headlights on).

Major Short—Trouble Shooting

In trouble shooting the vehicle wiring system, if the tester is producing a warbling tone, the presence of a major short in the vehicle wiring system is audibly apparent, as previously explained in connection with the major short MA. When a warbling tone is heard, the first step is to turn all switches off. If the warbling tone persists, this indicates that the major short is ahead of the switches (and unfused in the vehicle circuit shown).

For example, assume that there is a major short MA-1 to ground ahead of the vehicle ammeter. This short is a direct drain on the battery and would probably burn up or smoke wires, without blowing a fuse, and if the engine had been running, it would stop. With such a short, the battery cable must be quickly disconnected to prevent further damage to the electrical system. Fortunately, this is an emergency condition that is rarely encountered, because there are usually few wires (and these are short and heavily insulated) between the battery terminal and the vehicle ammeter.

To isolate the unfused major short MA-1, the tester is installed as previously described. Now there is no danger of any further damage to the wiring, even though the tester is signalling the presence of the major short MA-1. The distinct major short signal (warbling tone) will continue regardless of the condition of the various switches, but a short such as MA-1 is partially isolated when all switches are turned off because persistence of the warbling tone indicates that the short is ahead of the switches. The mechanic can now liesurly disconnect non-fused wires going to various items in the car's electrical system upstream of the switches, such as the voltage regulator, the generator, the ammeter, the horn relay, or any other wire connected directly to the primary battery wire. When the shorted unit or wire is disconnected, the tester apeaker will be silenced, thus indicating where the short lies. There is no need to disconnect the battery cable and prod here and there with an ohmmeter or probe to isolate the short, and even if a conventional meter were used, wires must often be disconnected to isolate the short because of branching circuits.

Now assume the presence of a major short MA-2, which is unfused but is downstream of a switch, such as the tail light switch TS. Again, the battery cable is disconnected and the tester installed, because if the short MA-2 were to be energized by turning on the tail light switch TS, some wires would burn or the ammeter might be damaged. However, with the battery cable SL-1 disconnected and the tester connected in its place, there is no danger of burning wires or damaging the vehicle ammeter when the switch is turned on, yet the warbling tone from the tester will indicate that a major short exists.

When the switch TS is turned off, the tester will not indicate the short MA-2 and since the original fuse F1-A was not blown when the switch was turned on before the tester was installed, this partially isolates the short. The same procedure of systematically disconnecting suspected wiring downstream of the switch will soon determine which circuit is shorted. In some cases, removal of a bulb in a lighting circuit that is turned on will silence the tester and assist in isolating a lead which is shorted.

Now for another example, assume that a fused circuit has the major short MA, previously discussed in explaining operation of the tester. This circuit also happens to be controlled by a switch, such as a tail light switch TS. If there is a major short MA in the tail light circuit sufficient to blow a fuse, the original fuse F1A will blow when the switch TS is turned on. However, with the tester installed, a replacement fuse F1 is fitted and the tail light switch TS can be turned on without blowing the new fuse. The tester will now indicate a major short (warbling tone). Trouble shooting is conducted in the manner described, except that again, the general location of the short has been determined.

It will be here mentioned that when cars have an electric clock and the clock runs down, contacts close which energize a high current solenoid in the clock to rewind it and this will momentarily indicate a major short to current sensitive test instruments. Of course, if the battery is simply disconnected for conventional leakage testing by an ohm meter, the clock will not rewind. However, with the present tester installed, as soon as the clock contacts close, the tester momentarily indicates a major short and it momentarily supplies full battery voltage to the tested circuit, enabling the clock to rewind and after a fraction of a second the clock is rewound, which will silence the major short indicating circuit of the tester. The mechanic will know that a signal caused by clock rewind is not a true short because it only lasts for a fraction of a second. Newer vehicles are fitted with clocks which draw a low current continuously. This will signal a minor short which can be silenced by removing the fuse in the clock circuit if there is no short in that circuit.

Thus, regardless of the cause of the major short, it can be located while maintaining all circuits in operation and fused.

As mentioned, the warbling, major short indicating tone produced by oscillator IC-1 continues when a blown fuse is replaced, and the operator need not observe the tester or the condition of bulbs L1,L2 during his trouble shooting procedure. During trouble shooting, the operator could be underneath the car or partially under the dash, physically moving or disconnecting wires and if the warbling tone ceases, the operator knows he has moved or disconnected the wire that leads to the major short.

Minor Short Operation

Referring to FIG. 4, once the instrument has been connected to the electrical system as previously described, if a minor short exists, the speaker S will produce a continuous tone H3 of about 3,000 Hz that is easily distinguishable from the warbling tone of a major short.

By way of a preferred example, a minor short is defined as any load on the battery that draws about 5-10 milliampere (preferably about 10) which is far below the current required to blow a fuse. The ability of the tester to detect and signal such low current drains enables it to detect that frustrating short which has given no indication of its presence, but which presents the driver with a dead battery after his vehicle has not been driven for some period of time. One of many such minor shorts results from leaky alternator diodes, for example. The tester will reveal the presence of a minor short that does not blow most fuses or does not indicate on a dashboard ammeter or a dashboard indicator light and yet is enough to drain the battery over a period of time. The tester of the present invention will clearly distinguish a minor short from a major short automatically.

As seen in FIG. 4, assume, for example, that a minor short MS is located in or ahead of the voltage regulator VR. However, a minor short can occur at any place in the vehicle wiring system, as in the vehicle lead 82 from the ammeter, or in the lead 84 to the generator etc., but the tester operation will be the same in all cases.

Referring to FIG. 4, at the instant the tester is connected into the vehicle circuit, the trigger transistor Q1 and SCR are turned off but current drawn by the minor short MS flows through potentiometer R3a and through resistors R1a,R2. This renders the positive potential on sensor lead SL slightly negative relative to its unshorted positive potential, the degree of potential lowering depending on the resistance of the minor short MS. A slight current flow as low as 5-10 milliamperes (or lower, if desired) through R1a, R2 will lower the potential of line 12 at the junction of R1,R2 sufficiently to bias the base of the trigger transistor Q1 to conduction. The current flow through R3a before SCR conducts is insufficient to bias the discriminator transistor Q2 into conduction.

With Q1 conducting, the SCR is turned on as before, and the small current drain caused by the minor short flows from the positive current lead CL, through line 22 and SCR, through line 24, diode D1 and lamps L1,L2 to the sensor lead SL. This current holds SCR conducting regardless of the state of the trigger transistor Q1.

Although power is supplied from CL and diode D to line 32, the power line for the Vcc terminals 8 of both oscillator chips IC-1 and IC-2, as will be seen, the discriminator transistor Q2 is not biased to conduction and hence the major short oscillator IC-2 does not operate during a minor short.

There is current flowing through line 60 from line 30, diode D2, line 31, line 60 and through R8 to the discharge pin 7 of the minor tone oscillator IC-1 as well as through line 62, R9 and line 64 to the trigger and threshhold terminals 2, 6 of that oscillator. As mentioned, current also flows through line 32a to reset pin 4 and Vcc pin 8, supplying power to the oscillator IC-1. Current is also available to the corresponding pins of the major short oscillator IC-2, but as mentioned, the latter is not triggered to oscillation. The minor short oscillator IC-1 is now producing an oscillating output at pin 3 of about 3,000 Hz causing the speaker S to emit a continuous tone H3 at that frequency, said tone being a steady tone that is clearly distinguishable from the warbling tone of a major short.

Since the SCR is turned on, the small current drain from the minor short MS passes through line 24, diode D1 and through the 12 volt bulbs L1 and L2. However, the minor short current is so low that the bulbs are either not lit or at most, dimly lit. The bulbs now offer a resistance (such as a fraction of an ohm) that is much lower than the resistance of the minor short MS in the vehicle wiring system, in series with the bulbs and ground. The low resistance path through the bulbs holds the sensor lead SL at virtually the full positive battery potential of the current lead CL. With virtually no potential difference between SL and CL, there is no significant voltage drop across the potentiometer R3a. Thus the center tap 29 of the potentiometer R3a is sufficiently positive to bias the base of the discriminator transistor Q2 to cut off, whereas the voltage drop across R3a was sufficient to bias Q2 into conduction in the presence of a major short.

With Q2 cut off, no current flows in the collector line 40 of Q2 and resistor R5 connected between line 40 and ground, holds line 40 at ground potential.

Line 40 is connected through R6 to the discharge pin 7 and through R7 to the trigger pin 2 of the major short oscillator IC-2. Since current at a positive potential in line 40 is required to trigger IC-2 into oscillation, the control voltage pin 5 of the minor short oscillator IC-1 receives no modulating pulses through R10. Thus, the normal continuous tone of about 3,000 Hz from the minor short oscillator IC-1 is produced by the speaker, indicating the presence of a minor short.

Trouble Shooting Minor Shorts

When the minor short oscillator IC-1 oscillates at its normal frequency, producing a continuous tone H3 of about 3,000 Hz from the speaker, the mechanic knows that a short exists, but that it is a minor or low drain short and he will first direct his trouble shooting efforts to portions of the vehicle wiring circuit to those which normally have some resistance. It can be assumed (if all switches are off) that there are no fully grounded wires because these would indicate a major short. This usually narrows down his search for the minor short leakage. As mentioned, the sensor lead SL is now held at a positive potential and in the present example, R3a is adjusted so that it will stay at a positive potential unless more than 8-10 amperes are drawn through the tester and the short. As mentioned, if during the testing period, the clock runs down, contacts will close and draw a current through the vehicle which is comparable to that drawn by a major short, giving a momentary major short signal and after the clock has been wound, the tester will revert to its minor short signal. Also, other electrical units in the vehicle wiring system can be double checked to see if they are not turned on or operating at this time (e.g. a radio, tape deck, etc.), because they are now supplied with operating current through the tester, even though the tester will detect a short load as small as one milliampere. For example, if the radio had been left on but at a very low volume or in a condition wherein it does not play, the radio can be turned off and then one can proceed further to determine if there is still a minor short in the vehicle by listening to the tone from the tester. Newer vehicles fitted with continuously running low drain clocks will indicate a minor short with all switches off. This current drain is removed by removing the fuse in the clock circuit or by disconnecting a clock terminal. If the minor short signal persists, the short is in the clock circuit.

If the headlight switch is turned on, the relatively low resistance of these bulbs will act as either a minor or a major short to the tester because they usually draw more than the selected threshhold value of 8-10 amperes, and the nature of the signal depends on the selected threshhold value. If it is set for about 10 amperes, when the headlights are on they will signal a minor short. However, this is a minor detail because unless the short is in the headlight circuit itself, the short signal stops when the headlights are turned off. Thus, if one is looking for a major short or a minor short in the headlight wiring, one must remove the headlight bulbs (but usually not the tail light bulbs) before testing this part of the vehicle circuit.

A minor short at the voltage regulator VR can be located by disconnecting the wire from the battery lead to the regulator and at this time, or whenever all shorts are removed, the sensor lead SL will see almost an infinite resistance to ground. This will render base line 12 of trigger transistor Q1 positive through R1a so that Q1 is cut off and supplies no current to the gate of the SCR. When the minor short is removed, no current is being drawn through the sensor lead SL, the bulbs L1 and L2, and diode D1 and the SCR turns off. There is no positive potential on line 31 to operate the minor short oscillator IC-1, and no tone is emitted by the speaker.

In the 12 volt system example given, the parallel bulbs L1 L2 are 12 volt automotive headlight bulbs, and one bulb (L2) has dual filaments connected in parallel. An ordinary 12 volt automobile headlight bulb filament has a resistance of about ½ ohn or less when drawing no current but when it is supplied with sufficient current to produce light, its resistance increases to about 3-6 ohms, and it draws a current of about 2-3 amperes as can be observed when operating a vehicle fitted with an anemeter and considering the fact that two bulbs are lit. This represents an increase in filament resistance by a factor of at least 6. This arrangement provides a rough approximation of a suitable discrimination point. The variable resistance action supplied by the bulbs is preferred to that which would be supplied by an ordinary wire wound heater resistance. This is because the bulb filaments are encased in a glass envelope containing an inert gas. Thus under major short conditions the bulb filaments are brought to a white heat (with a corresponding increase in resistance) almost instantly, whereas a heater resistance would heat up at a much slower rate. The potentiometer R3a was set to provide a more precisely selected discrimination or threshhold point of about 8–10 amperes, but the exact current value at the discrimination point is immaterial to the principle of operation of the tester. The threshhold current is merely selected as an aid to giving the mechanic a clue as to a probably location of the short. The tester automatically provides discrete tones of different frequencies for major and minor shorts, including a minor short which draws so little current that only the most sensitive meters will detect it.

It will be noted that several changes have been made in the circuit diagrams of FIGS. 2–2 that were not in these figures as originally filed in the parent application Ser. No. 851,593. One change is the addition of resistance R15. This resistor was present in the original circuit as constructed and successfully tested by trouble shooting several cars before my parent application was filed, but the resistor R15 was inadvertantly omitted from the circuit diagram I prepared for preparation of my parent patent application.

The other changes were made by me soon after the parent application was filed when the original or first model circuit was rewired to provide a second model employing a printed circuit. Although the basic mode of operation of the second model is exactly like that of the original model it was found that the current drawn characteristics of the commercial 555 oscillators (which are plugged into the circuit board) vary somewhat and that with some oscillators the turnoff action under no short conditions was not perfectly reliable. These changes are isolation of the power supply line 32 to the oscillators from the diode D2 and supplying the power to line 32 from CL through diode D. Also R1 was changed from a value of 15K to 39K, R3a, was changed from 2K to 10K and R8A was added. These changes rendered the turn-off action of the tester completely reliable when various commercial 555 oscillators were plugged into the circuit.

Brief Description of the Improved Circuit

FIG. 5 is a schematic diagram of an improved and now preferred circuit wherein the resistance action of the light bulbs of the original circuit is supplied by a silicon power transistor and associated control circuitry. In describing FIG. 5, where circuit elements perform the same function and have the same values, their reference numerals are unchanged. Where only there values are different, their reference numerals are suffixed by the small letter "a". Where circuit elements have been replaced or added, new reference numerals are applied.

As before, the circuit diagram of FIG. 5 shows the circuit of the tester T' connected to the 12 volt, negative ground vehicle battery and wiring system and also shows a few of the elements of a typical vehicle wiring system. The positive battery cable BC (+) has been disconnected from the positive battery post and the clip lead CL-1 of the current lead CL has been connected to the post. The alligator clip SL-1 of the sensor lead SL has been connected to the disconnected battery cable BC (+) and the clip GL-1 for the ground lead GL has been grounded.

The circuit of the improved tester includes the sensitive silicon PNP trigger transistor Q1 for the gate of the silicon controlled rectifier switch SCR. The line 10 from the current lead CL connects through a 1500 ohm resistor R1a' to the base line 12 for the trigger transistor Q1. A 27K resistor R2a in series with R1a' connects the line 12 to the sensor lead SL through the line 14. The emitter of Q1 is connected to the current lead CL by the line 16 and the collector of Q1 is connected to the gate of SCR through the line 18, the 330 ohm resistor R4 and the line 20. The 6.8 ohm resistor R15 is connected from the gate terminal of SCR to the cathode terminal. The anode of SCR is connected to CL by the line 22 and its cathode is connected by the line 24 to the emitter of a 15 ampere power transistor Q3 which provides the resistance action formerly provided by the light bulbs L1,L2. The collector of power transistor Q3 is connected to line 90 which leads to sensor lead SL. Thus SCR and Q3 are connected across the current lead CL and the sensor lead SL.

The 15 ampere power transistor Q3 (which is mounted on a suitable heat sink, not shown) offers substantially no resistance to low leakage currents, but serves as a current dissipating resistance to prevent smoking of the vehicle wiring and the blowing of fuses in case of a major short, it forms part of the discriminator circuit DSC for discriminating between major and minor shorts. The base of power transistor Q3 connects to the emitter of a Darlington pair transistor Q4. The output collector of Q4 connects by line 79 to the collector line 90 of the power transistor Q3. Line 90 also connects the power transistor Q3 to the sensor lead SL. The input base of Q4 connects by line 92 and 10K resistor R16 to line 88. Line 88 receives current from current lead CL through a 56K resistor R12. Line 88 also connects to a line 91 from the discriminator circuit DSC through a 22K resister R13. Line 88 also connects to output pin 3 of major oscillator IC-2 through a 33K resistor R15, a line 89 and a line 74.

The discriminator circuit DSC includes a 10K potentiometer R3a connected between the cathode line 24 of the SCR and the sensor lead SL by the lines 26a and 28, an added 7.5 volt Zener diode D4, and a line 81. The center tap 29 of R1a connects to the base of the silicon PNP discriminator transistor Q2. The center tap 29 is adjusted to provide the selected bias for the base of Q2, which determines the threshhold point (such as 10 amperes) between major and minor short signals from the tester.

As before, the signal producing portion of the circuit includes the two oscillators, the minor short oscillator IC-1 and the modulator or major short oscillator IC-2.

In order to power the oscillators the current lead CL connects to the anode of the diode D and the cathode of the diode D connects to lines 32,32a and 32b which power the oscillators IC-1 and JC-2 by connecting to their Vcc and reset pins 8 and 4. Pin 1 of IC-2 is grounded to GL by line 34.

The line 30 leads from line 24, the SCR cathode line, to the emitter line 36 of the silicon discriminator transistor Q2. The collector line 40 of Q2 is connected to ground through the 10K resistor R5 and collector line 40 also connects to the discharge pin 7 of IC-2 through a 240 ohm resistor R16, line 86 and through a 10K resistor R6a. Line 86, is connected to the cathode of a grounded 10 volt Zener diode D5, the latter being shunted by a 0.1 mf condenser C8. The anode of diode D5 and the negative terminal of capacitor C8 are grounded or are connected to GL. The branch line 46 from pin 7 of IC-2 connects through a 3.9K resistor R7a to the line 48 leading to the trigger and threshhold pins 2, 6 of the major short oscillator IC-2. This circuit is timed by the 10 mf condenser C4 which is connected to the ground lead GL by the line 50. The control voltage pin 5 of IC-2 is connected to a 0.047 mf condenser C5a which is also connected to the ground lead GL by the line 50.

The discharge pin 7 of the minor short tone oscillator IC-1 receives current from the line 60 leading from the line 31 and the cathode of the diode D2. The line 60 connects to pin 7 through the 4.7 K resistor R8. As before, line 31 is grounded through the 15K resistor R8A and the 0.1 mf capacitor C1. The anode of diode D2 connects to line 30 from the cathode line 24 of SCR. The trigger and threshold pins 2, 6 of IC-1 receive current from line 30, diode D2, lines 31 and 60 and the lower end of R8 by the branch line 62, the 4.7 K resistor $9 and the line 64. The line 64 connects to one side of the 0.2 mf 10 volt timing condenser C2, the other side of which is grounded. Pin 1 of IC-1 is grounded to GL by the line 76. It is to be noted that in some portions of the circuit diagrams conventional ground symbols are used, but functionally, these represent connections to the ground lead GL within the instrument.

The control voltage pin 5 of the minor short oscillator IC-1 receives negative going modulation pulses from pin 3 of the major short oscillator IC-2 by the line 74, a 1K ohm resistor R10a, line 87 to the cathode of a diode D3, line 72 from the anode of diode D3, and a 6.8K resistor R14. The lower end of R14 and line 72 are connected to a 10 mf capacitor C6 which is grounded by GL. Line 74 for the output pin 3 of IC-2 also connects by the line 89 to line 88 through a 33K resistor R15.

As before, the coil of the miniature electrodynamic speaker S is connected between the ground lead GL and the output pin 3 of the minor short oscillator IC-1 by a line 78, the speaker coil, the line 80, and 10 mf condenser C3 and the line 82.

OPERATION

No Short Condition

As in the original circuit, in order to test for a short, whether it draws a few milliameres, or draws enough current to smoke wires or blow out a fuse, in the embodiment described for negative grounded circuits, the positive battery cable BC (+) is disconnected, the current lead CL is connected to the (+) battery terminal, the sensor lead SL is clipped to the positive battery cable BC (+), and the ground lead GL is grounded. These connections are never changed during the test procedures.

When there is no short and no current drain from the vehicle wiring system, the sensor lead SL will see an almost infinite resistance to ground, will be at the full positive battery potential (e.g. 12 volts) and thus will draw no current either through R1a,R2a. With no voltage drop across resistors R1a',R2a, the base line 12 from the junction of R1a',R2a for the trigger transistor Q1 will be at full positive battery potential, which will reverse bias the base of Q1 and render it non-conducting. When Q1 is non-conducting, no current flows from its collector line 18, through R4 and through line 20 to the gate of the SCR. The SCR is non-conducting and its anode line 22 draws no current from the positive current lead CL. Resistor R15 now holds the gate of SCR at its cathode potential.

When SCR is non-conducting, the voltage at its cathode line 24 will be negative, relative to its anode line 22. The cathode line 24 of SCR cannot be rendered positive from the current lead CL through resistors R1a,R2a, Sl, line 90 and through the power transistor Q3 because of the reversed biased diode action of the power transistor Q3. Thus, under no short conditions, the cathode line 24 of SCR will be held at a negative potential relative to its anode line 22 because of a connection of cathode line 24 to ground through line 30, diode D2 and R8A. With SCR non-conducting, no current flows from line 30 through diode D2 to lines 31 and 60 and hence there is no current in line 60 to R8 for the discharge terminal pin 7 of the 555 oscillator IC-1. Thus oscillator IC-1 is turned off.

The oscillators are wired for astable operation (oscillation) but under the "no short" condition just described, neither will oscillate, and the speaker S is silent.

The major short oscillator IC-2 is also non-oscillating because the NPN discriminator transistor Q2 does not conduct. The center tap 29 of the potentiometer R3a, which biases the base of the discriminator transistor Q2, is set at a selected positive potential from the positive current lead CL. Since the sensor lead SL is not grounded through the vehicle wiring system (with no short and all switches turned off), the sensor lead SL is held at full positive potential through R1a and R2a. The emitter line 36 of Q2 is connected to line 30, which is grounded through diode D2 and 15k resistor R8A, and hence the base line 29 of Q2 is positive relative to the emitter. Thus, the discriminator transistor Q2 is reverse biased and is non-conducting.

As mentioned, when the discriminator transistor Q2 is not conducting, the major short oscillator IC-2 will not oscillate, because under no short conditions, there is no current flowing in the collector line 40 of Q2 and this line will be held at ground potential through grounded resistor R5. Even though IC-2 is receiving power, collector line 40 of Q2 must supply current at a positive potential through R16 and R6a to pins 7 (discharge), 2 (trigger) and 6 (threshold) to initiate oscillation at the output terminal 3 of the oscillator. The output terminal 3 of IC-2 supplies no modulation frequency through Thus R10a, diode D3 and R14 to the control voltage pin 5 of the minor short oscillator IC-1, but this is immaterial because the minor short oscillator IC-1 receives no current at pin 7 from R8, lines 60, 31 and SCR under no short conditions, is not oscillating and the speaker remains silent.

MAJOR SHORT

It will be assumed by way of example that the resistance of power transistor Q3 and the setting of potentiometer R3a is such that the threshhold between the minimum major short current and the maximum minor short current is a current of about 10 amperes. This threshold current selection merely represents a preferred or typical selected value, one reason for its selection being that the current of ten amperes will not blow must fuses, and the switching on of vehicle components such as the ignition switch, head lights, stop lights, etc.

will not provide a major short signal, although a minor short signal is provided when such components are turned on. Of course, during testing switchable vehicle components are turned off.

As in FIG. 3, it will be assumed (by way of example) that a fused major short MA to ground is in the circuit of the vehicle tail lights TL. As will be explained, if the major short MA draws a current of 8 amperes or more, the sensor lead SL is held at substantially ground or negative potential (providing an unblown fuse F1 is installed in the circuit) by the short. As previously described, the sensor lead SL was at a positive potential under no short conditions. However, the relatively high current crain caused by the major short MA automatically creates a new circuit condition in the tester circuit.

The substantially grounding of sensor lead SL by the major short MA draws current through line 14, R1a',-R2a, line 10 and CL. Because of the voltage drop across R1a', the base line 12 of the trigger transistor Q1 is now at a negative potential, relative to its emitter line 16 which is at a positive potential from line 10. This applies a negative bias to the base of trigger transistor Q1 which now conducts current from its emitter line 16, through the transistor, the collector line 18, R4, line 20 and hence to the gate of SCR.

The SCR now conducts and current flows from the positive terminal of battery B and current lead CL through line 22 to the anode of SCR. Current flows through SCR to cathode line 24 to the emitter of power transistor Q3, through Q3 (not conducting) to the collector line 90 and the sensor lead SL. The manner in which Q3 is rendered conducting by a major short will be explained presently. The major short current flow continues through the disconnected battery cable BC(+) through the ammeter of the vehicle, through the tail light switch TS (closed for test purposes) through the fuse F1 (it is again assumed that the original fuse F1A blew and has been replaced by a new fuse F1, FIG. 2, which will not blow, as in the first embodiment) and through the major short MA to ground. Since SCR is conducting due to a major short that is sufficient to blow a fuse, the power transistor Q3, although it is conducting 10 amperes or more has the effect of a resistance and hence provides a voltage drop and dissipates enough power to prevent blowing of a fuse in the shorted circuit.

The power transistor Q3 is caused to conduct by the Darlington pair transistor Q4, connected between the base and the collector of Q3. In order to reduce the conduction time of the power transistor Q3 so that its conventional ribbed aluminum heat sink (not shown) keeps the transistor cool, the input base line 92 of the Darlington transistor Q4 is switched back and forth from a negative going pulse to a positive going pulse as will be explained presently. Briefly, the Darlington transistor Q4 is turned on by negative going pulses which turn on power transistor Q3 at a rate of 3 HZ received from a 10K resistor R16, through line 88, 33K resistor R15, and line 89 connected to the line 74 from the output pin 3 of major short oscillator IC-2. As will be seen, the resistors which time the output pin 3 of IC-2 cause the output to be a square wave SW (FIG. 5) with alternate negative and positive going pulses. The square wave voltage output is low for about 20% of a total cycle so that during a major short Q4 and hence power transistor Q3 are only turned on about 20% of the time. Since the power transistor is switched off and on in this manner, at a 3 Hz rate, the power transistor remains cool under major short conditions, particularly since it is mounted on a heat sink.

Circuit operation can first be analyzed on the assumption that the transistor Q3 conducts continuously during a major short. The resultant voltage drop across the power transistor renders the sensor lead SL more negative than it was when SCR was turned off. However, the voltage at the SCR cathode line 24 is positive and a current at a positive potential passes through branch line 30, diode D2 to line 60, supplying operating potential to the discharge pin 7 of the minor oscillator IC-1, causing it to oscillate at its normal, predetermined audio frequency (about 3,000 Hz) at its output pin 3. This signal flows through line 82, condenser C3, line 80, the coil of speaker S and line 78 to the ground lead GL. During a major short, although a continuous frequency signal from IC-1 energizes the speaker, the frequency of the signal from IC-1 is modulated, as in the original circuit.

As mentioned, under major short conditions, the discriminator transistor Q2 (which is also part of the discriminator circuit DSC) is rendered conducting. The sensor lead SL is connected by a line 83 is the anode of a 7.5 volt Zener diode D4; the cathode of D4 is connected by line 28 to the low end of the potentiometer R3a to bring its center tap 29 to a negative potential relative to the emitter line 36 which is at a positive potential of about 11 volts when SCR is conducting. The center tap 29 of R3a was initially adjusted to forward bias the transistor Q2 into conduction under major short conditions, such as a current of 10 amperes, for example. If a threshhold current of 10 amperes is selected, turning on the headlights will usually indicate a minor, and not a major short.

With Q2 conducting, current flows from the cathode line 24 of SCR, through branch line 30, emitter line 36, the discriminator transistor Q2, its collector line 40, and through R16 and R6a. Current is now supplied to the discharge pin 7 of the major short oscillator IC-2 as well as through line 46, R7a and line 48 to the trigger and threshhold pins 2, 6 of that oscillator, initiating its oscillation. The Zener diode D5 in parallel with the capacitor C8 filter holds the voltage on line 86 at 10 volts, providing stable, circuit operation.

The time constant of R7a and condenser C4 connected between the discharge pin 7 of IC-2 and the ground lead GL causes IC-2 to oscillate at a three Hz frequency in the present example, providing the aforesaid substantially square wave output SW. The duty cycle of this oscillation is such that its output remains low after a negative going pulse for about 20% of a cycle and is high after the next positive going pulse about 80% of a cycle. The output line 74 from pin 3 of IC-2 has one connection to the line 89, R15, line 88 and R16 to the input line 92 for the Darlington pair transistor Q4. Hence, Q4 and the power transistor Q3 are only turned for about 20% of on cycle from pin 3 of IC-2. The output pin 3 of IC-2 is also connected through line 74, R10a, D3, line 72, and R14 to the control voltage pin 5 of the minor short oscillator IC-1. Capacitor C6 (10 mf) and R10a form an integration circuit that produces a saw-tooth wave form in line 72. This wave form is impressed on control terminal pin 5 of IC-1 through the resistor R14, said resistor prevents loading of the integration circuit by IC-1. The 3 Hz signal from IC-2 modulates the normal 3,000 Herz output signal of IC-1 at pin 3 to vary in a warbling or siren-like manner between about 4,000 Hz and about 2,000 Hz (with the circuit values given) at a modulation frequency of 3 Hz. Also, and as previously mentioned, the square-wave output of major short oscillator IC-2, which has a duty cycle of 20% on, 80% off, appearing on line 74, is coupled through a 33K resistor R15 to line 88, the input of the Darlington amplifier Q4 that controls the conduction (effective resistance) of silicon power transistor Q3. Thus, the power transistor Q3 is turned off and on at a 3 Hz rate with a 20% on duty cycle. Turning off Q3 for 80% of the cycle time prevents overheating of power transistor Q3 during a major short and also prevents blowing of low ampere fuses.

Thus, under major short conditions, both oscillators are oscillating and oscillator IC-1 produces a warbling, or siren-like tone through the speaker, which is easily distinguished from its normal constant frequency tone or from any other tone made by the tester under conditions other than those produced by a major short, such as the short MA. Note that under these conditions, the tester is supplying 8–10 ampere current pulses to the vehicle wiring at a 3 Hz rate, thus effectively testing for shorts 3 times each second.

Major Short—Trouble Shooting

As in the previous form of FIG. 3, in trouble shooting the vehicle wiring system, if the tester is producing a warbling or siren-like tone, the presence of a major short in the vehicle wiring system is audibly apparent. The trouble shooting procedures for typical major shorts such as MA, MA-1, MA-2 and others is like that previously described and will not be repeated. On some cars, a constantly running low drain clock is fitted. Under these conditions after the major short has been isolated and removed, the tester will produce a continuous minor short signal even when all vehicle switches have been turned off. Such clocks are usually fused and the minor short signal will stop when the clock fuse is removed or a clock terminal disconnected. Of course, if the minor short signal persists, this indicates that both a major short (not isolated) and a minor short were present in the vehicle wiring system.

Minor Short Operation

As in the circuit of FIG. 4, once the instrument has been connected to the electrical system as previously described, if a minor short exists, the speaker S will produce a continuous Hz tone of about 3,000 Hz that is easily distinguishable from the warbling or siren-like tone of a major short.

By way of example, a minor short is defined as any load on the battery that draws more than about 5–10 milliamperes and less than enough current to blow a fuse, preferably about 10 amperes. The ability of the tester of both embodiments to detect and signal such low current drains enables it to detect that frustrating short which has not been driven for some period of time. One of many such minor shorts results from leaky alternator diodes, for example. The tester will reveal the presence of a minor short that does not blow most fuses or does not indicate on a dashboard ammeter or a dashboard indicator light and yet is enough to drain the battery over a period of time. The tester of the present invention will clearly distinguish a minor short from a major short automatically.

As seen in FIG. 5, assume, for example, that a minor short MS is located in or ahead of the voltage regulator VR. However, a minor short can occur at any place in the vehicle wiring system, as in the vehicle lead 82 from the ammeter, or in the lead 84 to the generator, etc., but the tester operation will be the same in all cases.

Referring to FIG. 5, at the instant the tester is connected into the vehicle circuit, the trigger transistor Q1 and SCR are turned off but current drawn by a minor short such as MS flows through potentiometer R3a and through resistors R1a',R2a. As before, this renders the positive potential of sensor lead SL slightly negative relative to its unshorted positive potential, the degree of potential lowering depending on the resistance of the minor short MS. A slight current flow as low as a few milliamperes through R1a',R2a will lower the potential of line 12 at the junction of R1a',R2a sufficiently to bias the base of the trigger transistor Q1 to conduction. The current flow through R3a before SCR conducts is insufficient to bias the discriminator transistor Q2 into conduction.

With Q1 conducting, the SCR is turned on as before, and the small current drain caused by the minor short flows from the positive current lead CL, through line 22 and SCR, through line 24, and power transistor Q3 to the sensor lead SL. The 15 ampere power transistor Q3 has a resistance of a fraction of an ohm when it is conducting during a minor short, and hence acts as a low resistance, as do the bulbs in the forms of FIGS. 1–4. This low current holds SCR conducting regardless of the state of the trigger transistor Q1.

Current is also supplied from line CL through diode D to line 32, the power line for the Vcc terminals 8 of both oscillator chips IC-1 and IC-2. However, and as will be seen, under minor short conditions and discriminator transistor Q2 is not biased to conduction and hence terminal 7 of oscillator IC-2 does not receive current during a minor short.

Since SCR is conducting, there is current flowing from line 24 through line 30, diode D2, lines 31 and 60 and through R8 to the discharge pin 7 of the minor tone oscillator IC-1. Current also flows through line 62, R9 and line 64.

With Q1 conducting, the SCR is turned on as before, and the small current drain caused by the minor short flows from the positive current lead CL, through line 22 and SCR, through line 24, to the emitter of Q3, through Q3, through collector line 90 to the sensor lead SL. This current holds SCR conducting regardless of the state of the trigger transistor Q1.

As mentioned, when power transistor Q3 is conducting, it acts as a low resistance to the minor short current. Line 88, the input of the Darlington amplifier Q4, that controls Q3, is connected by line 91 to line 86 through a 22K resistor R 13. The voltage on line 86 is held close to ground potential by the 10K resistor R5, because the discriminator transistor Q2 is not conducting during a minor short, as mentioned earlier. The ground potential on line 86 pulls lines 91 and 88 sufficiently toward ground potential through the 22K resistor R13 to turn on the Darlington pair transistor Q4 through 10K resistor R16 and line 92. The resistor R12 (56K) connected between line 88 and current lead CL completes the current path through R13 but the voltage drop across R12 brings the potentials on lines 91 and 88 to a value low enough to turn Q4 on, the transistor Q4 being turned off only by a relatively high potential applied to its input base line 92. This occurs only when lines 40 and 86 are positive (during major short conditions) and when the output of major short oscillator IC-2, lines 74 and 80, is positive, as described under major short conditions. Q3 is biased to cut off under no short conditions.

Continuing the description of minor short operation, with SCR and Q3 conducting (but not Q2) there is current flowing through branch line 30, diode D2, lines 31 and 60, through R8 to the discharge pin 7 of the minor tone oscillator IC-1. Current also flows through line 62, R9 and line 64 to the trigger and threshhold terminals 2, 6 of that oscillator. As in the case of a major short, current also flows from CL through diode D1, line 32 and line 32a to reset pin 4 and Vcc pin 8, supplying power to the oscillator IC-1. Current is also available to the corresponding pins of the major short oscillator IC-2, but as will be seen, the latter receives no trigger signals and is not oscillating. The minor short oscillator IC-1 is now producing an oscillating output at pin 3 of 3,000 Hz causing the speaker S to emit a continuous tone at that frequency. This tone is clearly distinguishable from the warbling or siren line tone of a major short, when oscillator IC-2 is also oscillating.

Since the SCR is turned on, the small current drain from a minor short such as MS in FIG. 5 passes through line 24, through power transistor Q3, line 90, the sensor lead SL and the ground through the minor short. The power transistor Q3 now offers a low resistance (such as a fraction of an ohm) to the minor short current flow that is much lower than the resistance of the minor short MS in the vehicle wiring system. The aforesaid low resistance path through the power transistor Q3 (conducting) holds the sensor lead SL at virtually the full positive battery potential of the current lead CL. With virtually no potential difference between SL and CL, there is no significant voltage drop across the potentiometer R3a. Thus the center tap 29 of the potentiometer R3a is sufficiently positive to bias the base of the discriminator transistor Q2 to cut off, whereas the voltage drop across R3a was sufficient to bias Q2 into conduction in the presence of a major short.

With the discriminator transistor Q2 cut off, no current flows in the collector line 40 of Q2 and resistor R5 connected between line 40 and ground, which holds line 40 at ground potential.

Line 40 is connected through R16a and R6 to the discharge pin 7 and through R7 to the trigger pin 2 of the major short oscillator IC-2. However, since current at a positive potential in line 40 is required to trigger IC-2 into oscillation, and since line 40 is at ground potential, the control voltage pin 5 of the minor short oscillator IC-1 receives no modulating pulses from pin 3 of IC-2 through R10a, diode D3 and R14. Thus, only the normal continuous tone of about 3,000 Hz from the minor short oscillator IC-1 is produced by the speaker, indicating the presence of a minor short.

Trouble Shooting Minor Shorts

As in the original circuit, when the minor short oscillator IC-1 oscillates at its normal frequency, producing a continuous tone H3 of about 3,000 Hz from the speaker, the mechanic knows that a short exists, but that it is a minor or low drain short and he will first direct his trouble shooting efforts to portions of the vehicle wiring circuit to those which normally have some resistance. It can be assumed that there are no fully grounded wires because these would indicate a major short. This usually narrows down his search for the minor short leakage. As mentioned, the sensor lead SL is now held at a positive potential and in the present example, R3a is adjusted so that it will stay at a positive potential unless more than 8–10 amperes (preferably 10 so if the headlights have not been turned off only a minor short will be indicated) are drawn through the tester and the short. As mentioned, if during the testing period, the clock runs down, contacts will close and draw a current through the vehicle which is comparable to that drawn by a major short, giving a momentary major short signal and after the clock has been wound, the tester will revert to its minor short signal. The special condition wherein a low drain electric clock is fitted has been explained.

The basic trouble shooting procedure is the same as that previously described and will not be repeated.

It should be mentioned that in the circuit of FIG. 5, if the headlight switch is turned on, the relatively low resistance of these bulbs will first signal a major short to the tester because they usually draw more than the selected threshhold value of 10 amperes. However, after 3 or 4 current pulses the headlight bulb filaments heat up and the signal changes to that of a minor short. Of course this signal can be stopped by turning off the headlights, unless there is a short in the headlight wiring system itself, in which case the tester will so indicate.

To summarize, the operation of this tester is such that a short load of high resistance that draws only 6–10 milliamperes will trigger a device which will then supply up to 8–10 amperes (in the example given) to the vehicle circuits while indicating that a minor short exits. The tester will also wind the vehicle clock and will facilitate locating circuits that are still operating or have not been turned off completely in the vehicle. But once all circuits are turned off and every major or minor short load is removed, the tester turns itself off, stops emitting a tone and the sensor lead again becomes a very high impedance testing circuit which will detect currents as low as 5–10 milliamperes in the preferred adjustment. The circuit can be adjusted to detect lower currents but this degree of sensitivity is unnecessary. Also, if a major short occurs, the tester will not burn out or blow any fuses in the vehicle but will indicate by its special warbling tone that the major short is present. After the tester is connected to the vehicle under test, a blown fuse F1A can be replaced by a good fuse F1 (FIG. 3) and now the new fuse will not blow and wires will not smoke, even though there is a major short, such as MA in the circuit.

The tester automatically signals the presence of a minor short which gives no indication of its presence but which will drain the battery over a period of time. The mechanic can perform his trouble shooting with both hands free and from any position at the vehicle.

In this description and in the appended claims, the reference to "ground" is intended to apply to circuits which employ one or more return wires to the battery instead of using the more conventional chassis ground connection as a return. Also, although the preferred switch SCR is a solid state switch such as a silicon controlled rectifier, in the appended claims it is to be understood that the term solid state switch includes its solid state switch equivalent, a power transistor of ample current capacity the base of which is biased into conduction under the same conditions and in the same manner (by a trigger transistor amplifier) that the SCR is gated into conduction. The equivalency of these solid state switch devices is well known in the electronic arts. As is conventional with power transistors, if the transistor is an NPN, the base is driven positive relative to the emitter by a trigger transistor, or if it is a PNP, the base is driven negative relative to the emitter by a trigger transistor. However, I prefer to use a silicon controlled rectifier as the switch because the gate of an SCR requires less current for triggering than does the base of a power transistor.

Although two modes, including what is now considered to be the best mode contemplated for carrying out the present invention have been herein shown and described, it will be apparent that modifications and variations may be made without departing from what is regarded to be the subject matter of the invention as defined in the appended claims.

What I claim is:

1. A short circuit detector for battery powered circuits such as those employed in vehicles or the like wherein one battery cable is connected to the circuit and the other is grounded, said tester being of the type connected in series with the battery and having a current lead for connection to one battery terminal from which the battery cable has been disconnected, a sensor lead for connection to the disconnected cable, current dissipating means connected for conducting high currents across said leads caused by a major short and signal means for audibly indicating the presence of said short by one tone; the improvement wherein said detector has a ground connection, said current dissipating means offering a resistance of less than one ohm to minor short currents as low as a few milliamperes, main switch means in series with said current dissipating means across said leads, voltage dropping trigger resistance means connected across said leads, trigger switch means connected to sense a voltage drop in said trigger resistance means and to one of said leads for turning said main switch means on in response to the current drawn through said trigger resistance means by a minor short current of less than one ampere thereby independently energizing the circuit under test, said signal means having a discriminator control circuit having means for sensing the amount of current flowing through said main switch means and said current dissipating means and connected to said signal means for turning the latter on, said signal means having means for producing a different tone from said one tone, for signalling said minor short when said main switch means is turned on and means for powering said signal means from said current lead.

2. A short circuit detector for battery powered circuits such as those employed in vehicles or the like wherein one battery cable is connected to the circuit and the other is grounded, said tester being of the type connected in series with the battery and having a current lead for connection to one battery terminal from which the battery cable has been disconnected, a sensor lead for connection to the disconnected cable, current dissipating means across said leads for conducting current caused by a short and means for audibly indicating the presence of said short; the improvement wherein said current dissipating means offers a low resistance to minor shorts but will dissipate the current drawn by major shorts, main switch means in series with said current dissipating means across said leads, trigger resistance means connected across said leads for initially drawing current in the presence of a short, trigger means connected to sense a voltage drop across said trigger resistance means for turning said main switch means on in response to a short current as low as a few milliamperes, minor short signal means activated by current passing through said main switch means for audibly indicating the presence of said minor short with a tone having one frequency characteristic, discriminator means including means for sensing a voltage drop which is a function of the current flowing through said current dissipating means, and major short signal means activated by said discriminator means in the presence of a major short that draws enough current to cause a substantial voltage drop across said current dissipating means, said major short signal means having means for causing the production of a major short tone having another frequency characteristic.

3. The detector of claim 2, wherein said signal means comprises an audio oscillator having a normally uniform audio frequency in the presence of either a minor or a major short, transducer means operated by said audio oscillator, said signal means also comprising a low frequency oscillator for modulating the audio frequency of said audio oscillator to produce a warbling tone, said discriminator means supplying current for activating said low frequency oscillator in the presence of only one of said types of short.

4. The detector of claim 3, wherein said trigger means comprises a transistor for turning on said switch means.

5. The detector of claim 4, wherein said main switch means is a solid state switch and said trigger transistor controls the conduction of the switch.

6. The detector of claim 3, wherein said discriminator means for activating the low frequency oscillator comprises a discriminator transistor and discriminator resistance means connected in parallel with said current dissipating means for biasing said discriminator transistor into conduction in the presence of said one type of short.

7. The detector of claim 3 wherein the bias resistance means for said discriminator transistor is adjustable.

8. The detector of claim 3 wherein operating power is supplied to both of said oscillators from said current lead through diode means independently of the control current for the oscillators.

9. The detector of claim 3, wherein said main switch means is a solid state switch and said trigger transistor controls said switch.

10. The detector of claim 2, wherein said current dissipating means comprises a vehicle light bulb.

11. The detector of claim 2, wherein said current dissipating means comprises a power transistor, and transistor means for biasing said power transistor into conduction during the presence of a short.

12. The detector of claim 11, comprising means for causing said power transistor biasing means to cyclically turn the power transistor on and off in the presence of a major short for preventing overheating of the power transistor.

13. A short circuit detector for battery powered circuits such as those employed in vehicles or the like wherein one battery cable is connected to the circuit and the other is grounded, said tester being of the type connected in series with the battery and having a current lead for connection to one battery terminal from which the battery cable has been disconnected, a sensor lead for connection to the disconnected cable, means across said leads for dissipating relatively high currents caused by the short and means for audibly indicating the presence of said short; the improvement wherein said current dissipating means offers substantially no resistance to minor short currents as low as a few milliamperes and provides a substantial voltage drop when conducting major short currents of several amperes, main switch means connected in series with said current dissipating means across said current and sensor leads, trigger resistance means connected across said leads for initially sensing a short, trigger means connected to said trigger resistance and to said main switch means for instantly turning said main switch means on in response to the current initially drawn by said trigger resistance means including a minor short as low as a few milliamperes, oscillator and transducer means for producing short signals, said oscillator means having one control terminal for producing a signal of one frequency during a minor short that draws a current less than about one ampere, said oscillator means having another control terminal for producing a signal of another frequency during a major short that draws a current more than said minor short current, one of said oscillator control terminals being connected to receive current passing through said main switch means for activating the oscillator means to produce one signal in the presence of a minor short, and discriminator switching means connected to be quantitively responsive to the amount of current flowing across said leads during the presence of a short, said discriminator switching means also being connected to the other control terminal of said oscillator means for activating the latter to produce the other signal only when a major short is present.

14. A short circuit detector for battery powered circuits such as those employed in vehicles or the like wherein one battery cable is connected to the circuit and the other is grounded, said tester being of the type connected in series with the battery and having a current lead for connection to one battery terminal from which the battery cable has been disconnected, a sensor lead for connection to the disconnected cable, current dissipating means across said leads for dissipating relatively high currents caused by the short and means for audibly indicating the presence of said short; the improvement wherein said detector discriminates between a minor type short that draws a current less than several amperes and a major type short that draws a current greater than several amperes, said improved tester comprising main switch means connected in series with said current dissipating means across said current and sensor leads, trigger means comprising trigger resistance means connected across said leads and trigger switch means connected to said resistance means for turning said main switch means on in response to the current drawn by either type of short, transducer and first oscillator means for producing one tone that signals one of said types of short, second oscillator means for modulating said first oscillator means causing said transducer means to produce a warbling tone that signals the other of said types of short, discriminator resistance means in parallel with and responsive to the amount of current flowing through said current dissipating means and discriminating switch means connected to said discriminator resistance means, said discriminator switch means being connected to activate said second oscillator means during said other type of short.

15. A short circuit detector for battery powered circuits such as those employed in vehicles or the like wherein one battery cable is connected to the circuit and the other is grounded, said tester being of the type connected in series with the battery and having a current lead for connection to one battery terminal from which the battery cable has been disconnected, a sensor lead for connection to the disconnected cable, current dissipating means connected across said leads for conducting currents caused by a short and signal means for indicating the presence of said short; the improvement wherein said detector has a ground connection, relatively high resistance voltage dropping trigger resistance means connected across said leads, trigger switch means connected to an intermediate portion of said trigger resistance means and to one of said leads for actuation by a minor short current as low as a few milliamperes, main switch means connected in series with said current dissipating means across said leads, actuation of said trigger switch means turning said main switch means on in response to a short current as low as a fraction of an ampere, discriminator switch means, discriminator resistance means responsive to the current flowing through said main switch means in the presence of a short and connected to said discriminator switch means for placing said discriminator switch means in one state in the presence of a minor short current as low as several milliamperes and in another state in the presence of a major short current that exceeds several amperes, said signal means comprising audio oscillator means connected between said main switch means and ground, a transducer connected for operation by said audio oscillator means, said audio oscillator means causing said transducer to produce a tone having one distinctive frequency characteristic when said main switch means is turned on by the current drawn by a minor short with said discriminator means in said one state, and means for causing said audio oscillator and transducer to provide a tone of a different distinctive frequency characteristic when said discriminator switch means is placed in said other state as said discriminator resistance means senses the current drawn by a major short.

16. The detector of claim 15, wherein said trigger resistance means comprises transistor bias means, said trigger switch means comprising trigger transistor means, means connecting a first element of said trigger transistor means to said bias means for causing conduction of said trigger transistor means in response to a bias current that is at least as low as said minor short current, means connecting a second element of said trigger transistor means to said current lead and means connecting a third element of said trigger transistor means to said main switch means for turning the latter on when said trigger transistor means is biased into conduction by the current drawn by either a minor or a major short.

17. A short circuit detector for battery powered circuits such as those employed in vehicles or the like wherein one battery cable is connected to the circuit and the other is grounded, said tester being of the type connected in series with the battery and having a current lead for connection to one battery terminal from which the battery cable has been disconnected, a sensor lead for connection to the disconnected cable, current dissipating means conducted across said leads for conducting currents caused by a short and signal means for audibly indicating the presentce of said short by a tone; the improvement comprising trigger resistance means connected across said leads for sensing a voltage drop caused by a short current as low as a few milliamperes, trigger switch means connected for sensing said voltage drop, main switch means connected in series with said current dissipating means across said leads and connected for control by said trigger switch means, actuation of said trigger switch means during a short turning said main switch means on in response to the short current, discriminator means including discriminator switch means and means for controlling said discriminator switch means by the amount of current conducted by said main switch means for placing said discriminator switch means in one state in the presence of a major short current that exceeds several amperes and in another state in the presence of a minor short current as low as a few milliamperes, said signal means comprising oscillator means connected for control by current passing through said main switch means and by said discriminator switch means, a transducer connected to said oscillator means, said oscillator means having means for causing said transducer to produce a tone having one distinctive frequency characteristic in the presence of a major short when said discriminator switch means is in said one state and said oscillator means having means for causing said transducer to produce a tone of a different distinctive frequency characteristic in the presence of a minor short when said discriminator switch means is in said other state.

18. The detector of claim 17, wherein said main switch means comprises a solid state switch and said trigger switch means comprises a transistor biased by said trigger resistance means and connected to control said solid state switch.

19. The detector of claim 18, wherein said current dissipating means comprises power transistor means capable of conducting at least about 10 amperes, bias transistor means connected to said power transistor means for rendering the latter conducting during a short, circuit means for rendering said bias transistor means conducting for biasing said power transistor means into conduction when current is drawn by a short, said power transistor means having the effect of a low enough resistance when the amount of current conducted by said switch means is a minor short current as low as a few milliamperes to place the discriminator means into said other state for causing said oscillator means and transducer to produce a minor short tone, the dissipation of a major short current of several amperes by said power transistor means causing the latter to have the effect of a high enough resistance to place the discriminator switch means into said one state for causing said audio oscillator means and transducer to produce a major short tone.

20. The detector of claim 17, wherein the means for controlling said discriminator means includes discriminator resistance means in parallel with said current dissipating means for sensing the current flowing through said main switch means, said discriminator switch means comprising discriminator transistor means, said discriminator resistance means biasing said discriminator transistor means either to its cut-off state or into its conduction state, one of said states causing said oscillator means and transducer to produce a minor short tone and the other of said states causing the oscillator means and transducer to produce a major short tone.

21. The detector of claim 20, wherein the bias resistance means for said discriminator transistor means is set to produce a minor short tone when said switch means conducts current in the range of about 5 milliamperes to about 8-10 amperes, said bias means being set to produce a major short tone when said switch means conducts a current that exceeds about 8-10 amperes.

22. The detector of claim 17, wherein said current dissipating means is a power transistor, means for biasing said power transistor into conduction when said trigger switch means is activated by the presence of a short, said oscillator means including a low frequency oscillator that produces a low frequency signal of a few Hz, means for causing said discriminator switch means to activate said low frequency oscillator in the presence of a major short, means for causing said signal to turn the power transistor on and off during a major short for preventing overheating of said power transistor during a major short.

23. The detector of claim 22, wherein said oscillator means includes an audio oscillator that provides a signal of a few thousand Hz to said transducer during a short, said signal from said low frequency oscillator also being connected to said audio oscillator for modulating the output of the latter to produce a warbling tone from the transducer during a major short.

24. A short circuit detector for battery powered circuits such as those employed in vehicles or the like wherein one battery cable is connected to the circuit and the other is grounded, said tester being of the type connected in series with the battery and having a current lead for connection to one battery terminal from which the battery cable has been disconnected, a sensor lead for connection to the disconnected cable, current dissipating means connected for conducting currents across said leads caused by a short and signal means for indicating the presence of said short; the improvement wherein said detector has a ground connection, voltage dropping trigger resistance means across said leads, trigger switch means connected to sense a voltage drop in said trigger resistance means for actuation by a minor short current as low as a few milliamperes as well as by higher currents, main switch means having a control actuated by said trigger switch means and connected for conducting current across said leads through said current dissipating means, actuation of said trigger switch means turning on said main switch means in response to a low minor short current as well as to higher currents for independently energizing the circuit under test, voltage dropping discriminator resistance means connected to be responsive to the amount of current conducted across said leads by said main switch means, discriminator switch means connected to said discriminator resistance means for placing said discriminator switch means in one distinct state in the presence of a major short current that exceeds several amperes and in another distinct state in the presence of a minor short current as low as a few milliamperes, said signal means including a control terminal for actuation by current passing through said main switch means and a control terminal for actuation by said discriminator switch means, means for independently powering said signal means, means for causing said signal means to produce a signal having one distinctive characteristic in the presence of a major short when said discriminator means is in said one state and a signal having a different distinctive characteristic in the presence of a minor short when said discriminator means is in said other state.

25. The detector of claim 24, wherein said current dissipating means comprises power transistor means capable of conducting at least about 10 amperes, bias transistor means connected to said power transistor means for rendering the latter conducting, means for biasing said bias transistor means into conduction when current is drawn by a short, said power transistor means having the effect of a low enough resistance when the amount of current conducted by said switch means is a minor short current as low as a few milliamperes to place the discriminator means into said other state for producing a minor short signal, the dissipation of a major short current of several amperes by said power transistor means causing the latter to have the effect of a high enough resistance to place the discriminator means into said one state for producing a major short signal.

26. A short circuit detector for battery powered circuits such as those employed in vehicles or the like wherein one battery cable is connected to the circuit and the other is grounded, said tester being of the type connected in series with the battery and having a current lead for connection to one battery terminal from which the battery cable has been disconnected, a sensor lead for connection to the disconnected cable, current dissipating means connected for conducting current across said leads caused by a short and signal means for indicating the presence of said short; the improvement comprising voltage dropping trigger resistance means across said leads, trigger switch means connected to sense a voltage drop in said trigger resistance means for actuation of said trigger switch means by a minor short current as low as a few milliamperes as well as by the higher currents of major shots, main switch means having a control actuated by said trigger switch means and connected for conducting current across said leads through said current dissipating means, actuation of said trigger switch means in response to low minor short currents as well as to higher short currents turning said main switch means on for independently energizing the circuit under test, discriminator means, means connected to be responsive to the amount of current conducted across said leads by said current dissipating means connected to said discriminator means for placing said discriminator means in one distinct state in the presence of a major short current that exceeds several amperes and in another distinct state in the presence of a minor short current as low as a few milliamperes, said signal means having means for producing either of two signals having different distinct characteristics, means for causing said signal means to produce a signal having one distinctive characteristic in the presence of a major short when said discriminator means is in said one state and means for causing said signal means to produce a signal having a different distinctive characteristic in the presence of a minor short when said discriminator means is in said other state.

27. A short circuit detector for battery powered circuits such as those employed in vehicles or the like wherein one battery cable is connected to the circuit in series with the battery and having a current lead for connection to one battery terminal from which the battery cable has been disconnected, a sensor lead for connection to the disconnected cable, current dissipating means connected for conducting current across said leads caused by a short and signal means for indicating the presence of said short; the improvement wherein said detector has a ground connection, trigger means including means for sensing trigger current flowing across said leads and trigger switch means connected to said trigger current sensing means for actuation of said trigger switch means by a minor short current as low as a fraction of an ampere as well as by a higher major short current, main switch means having a control actuated by said trigger switch means and connected for conducting current across said leads through said current dissipating means, actuation of said trigger switch means in response to low minor short currents as well as to higher short currents turning said main switch means on for independently energizing the circuit under test, discriminator means having control and output connections, means for responding to the amount of current conducted across said leads by said current dissipating means and connected to said discriminator means, control for placing said discriminator means in one distinct state in the presence of a major short current that exceeds several amperes and in another distinct state in the presence of a minor short current as low as a fraction of an ampere, said signal means comprising control means connected to be responsive to the flow of current across said leads through said current dissipating means and a ground connection for producing a signal having one distinct characteristic in the presence of a minor short, said signal means also having control means connected to said discriminator means output connection for producing a signal having another distinctive characteristic when said discriminator means is in said one distinct state in the presence of a major short and means for powering said signal means.

* * * * *